United States Patent
Totzeck et al.

(10) Patent No.: US 7,474,469 B2
(45) Date of Patent: Jan. 6, 2009

(54) ARRANGEMENT OF OPTICAL ELEMENTS IN A MICROLITHOGRAPHIC PROJECTION EXPOSURE APPARATUS

(75) Inventors: Michael Totzeck, Gmuend (DE); Gerhart Fuerter, Ellwangen (DE); Olaf Dittmann, Bopfingen (DE); Karl-Heinz Schuster, Koenigsbronn (DE); David Shafer, Fairfield, CT (US); Susanne Beder, Aalen (DE); Wolfgang Singer, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/232,606

(22) Filed: Sep. 22, 2005

(65) Prior Publication Data
US 2006/0066962 A1 Mar. 30, 2006

Related U.S. Application Data

(63) Continuation-in-part of application No. PCT/EP2004/014728, filed on Dec. 27, 2004, and a continuation-in-part of application No. PCT/EP2004/014219, filed on Dec. 14, 2004.

(60) Provisional application No. 60/568,006, filed on May 4, 2004, provisional application No. 60/612,823, filed on Sep. 24, 2004, provisional application No. 60/530,623, filed on Dec. 19, 2004, provisional application No. 60/544,967, filed on Feb. 13, 2004, provisional application No. 60/568,006, filed on May 4, 2004, provisional application No. 60/591,775, filed on Jul. 27, 2004, provisional application No. 60/592,208, filed on Jul. 29, 2004, provisional application No. 60/612,823, filed on Sep. 24, 2004.

(51) Int. Cl.
*G02B 3/12* (2006.01)
*G02B 3/00* (2006.01)

(52) U.S. Cl. ..................... 359/665; 359/649
(58) Field of Classification Search .......... 359/665–667
See application file for complete search history.

(56) References Cited

U.S. PATENT DOCUMENTS 3,965,683 A * 6/1976 Dix .................... 60/641.15

(Continued)

FOREIGN PATENT DOCUMENTS

DE 221563 4/1985

(Continued)

OTHER PUBLICATIONS

International Search Report dated Jun. 10, 2005.

(Continued)

*Primary Examiner*—William C Choi
(74) *Attorney, Agent, or Firm*—Fish & Richardson P.C.

(57) ABSTRACT

The invention relates to an arrangement of optical elements in a microlithographic projection exposure apparatus, particularly in a projection objective of a microlithographic projection exposure apparatus. The arrangement comprises a rigid first optical element, a rigid second optical element with a first optical surface and a second optical surface on opposite sides and a first liquid. The first optical element has a concave optical surface. The first side of the second optical element is facing the concave optical surface of the first optical element. The first liquid is at least partially filling the space between the first optical element and the second optical element.

54 Claims, 5 Drawing Sheets

U.S. PATENT DOCUMENTS

| | | | |
|---|---|---|---|
| 3,976,364 A * | 8/1976 | Lindemann et al. | 359/667 |
| 4,346,164 A | 8/1982 | Tabarelli et al. | |
| 4,890,903 A | 1/1990 | Treisman et al. | |
| 5,446,591 A * | 8/1995 | Medlock | 359/666 |
| 5,627,674 A | 5/1997 | Robb | |
| 5,682,263 A * | 10/1997 | Robb et al. | 359/355 |
| 5,739,959 A * | 4/1998 | Quaglia | 359/666 |
| 5,883,704 A * | 3/1999 | Nishi et al. | 355/67 |
| 5,900,354 A | 5/1999 | Batchelder et al. | |
| 6,169,627 B1 | 1/2001 | Schuster | |
| 6,181,485 B1 * | 1/2001 | He | 359/719 |
| 6,496,306 B1 | 12/2002 | Shafer et al. | |
| 6,809,794 B1 | 10/2004 | Sewell | |
| 7,187,503 B2 | 3/2007 | Rostalski et al. | |
| 2002/0163629 A1 | 11/2002 | Switkes et al. | |
| 2002/0196533 A1 | 12/2002 | Shafer et al. | |
| 2003/0174408 A1 | 9/2003 | Rostalski et al. | |
| 2003/0224528 A1 | 12/2003 | Chiou et al. | |
| 2004/0075895 A1 | 4/2004 | Jeng et al. | |
| 2004/0105170 A1 | 6/2004 | Krahmer et al. | |
| 2004/0109237 A1 | 6/2004 | Epple et al. | |
| 2004/0125351 A1 | 7/2004 | Krautschik | |
| 2005/0024609 A1 | 2/2005 | De Smit et al. | |
| 2005/0068499 A1 | 3/2005 | Docdoc et al. | |
| 2005/0074704 A1 | 4/2005 | Endo et al. | |
| 2005/0117224 A1 | 6/2005 | Shafer et al. | |
| 2005/0161644 A1 | 7/2005 | Zhang et al. | |
| 2005/0179877 A1 | 8/2005 | Mulkens et al. | |
| 2005/0190435 A1 | 9/2005 | Shafer et al. | |
| 2005/0190455 A1 | 9/2005 | Rostalski et al. | |
| 2005/0219707 A1 | 10/2005 | Schuster et al. | |
| 2005/0225737 A1 | 10/2005 | Weissenreider et al. | |
| 2005/0248856 A1 * | 11/2005 | Omura et al. | 359/726 |
| 2006/0012885 A1 | 1/2006 | Beder et al. | |
| 2006/0187430 A1 | 8/2006 | Docdoc et al. | |
| 2006/0221456 A1 | 10/2006 | Shafer et al. | |
| 2006/0221582 A1 | 10/2006 | DeNies et al. | |
| 2006/0244938 A1 | 11/2006 | Schuster | |
| 2007/0052936 A1 | 3/2007 | Philips | |
| 2007/0091451 A1 | 4/2007 | Schuster | |
| 2007/0109659 A1 | 5/2007 | Rostalski et al. | |
| 2007/0165198 A1 | 7/2007 | Kneer et al. | |

FOREIGN PATENT DOCUMENTS

| | | |
|---|---|---|
| DE | 224448 | 7/1985 |
| EP | 0023231 | 2/1981 |
| EP | 0291596 | 1/1994 |
| EP | 1420302 | 5/2004 |
| EP | 1 489 462 | 12/2004 |
| EP | 1 491 956 | 12/2004 |
| EP | 1486827 | 12/2004 |
| EP | 1522894 | 4/2005 |
| EP | 1524558 | 4/2005 |
| EP | 1 557 721 | 7/2005 |
| EP | 1 630 616 | 3/2006 |
| EP | 1 645 911 | 4/2006 |
| JP | 07220990 | 8/1995 |
| JP | 10-228661 | 8/1998 |
| JP | 10-303114 | 11/1998 |
| JP | 2000-58436 | 2/2000 |
| WO | WO 01/50171 | 7/2001 |
| WO | WO 02/093209 | 11/2002 |
| WO | WO 2004/019128 A2 | 3/2004 |
| WO | WO 2004/057589 | 7/2004 |
| WO | WO 2004/107048 | 12/2004 |
| WO | WO 2005/006026 A2 | 1/2005 |
| WO | WO 2005/031823 | 4/2005 |
| WO | WO 2005/031823 A1 | 4/2005 |
| WO | WO 2005/059617 | 6/2005 |
| WO | WO 2005/059618 A2 | 6/2005 |
| WO | WO 2005/059645 A2 | 6/2005 |
| WO | WO 2005/081067 A1 | 9/2005 |
| WO | WO 2006/045748 | 5/2006 |

OTHER PUBLICATIONS

International Search Report dated Aug. 25, 2005.

U.S. Appl. No. 11/097,398, filed March 29, 2005 for "Projection Objective of a Microlithographic Projection Exposure Apparatus".

"Liquid Immersion Deep-Ultraviolet Interferometric Lithography", J.A. Hoffnagle, W.D. Hinsberg, M. Sanchez, and F.A. Houle, journal of vacuum science & technology B: microelectronics processing and phenomena, american vacuum society, New York, NY, US, vol. 17, No. 6, Nov. 1999, pp. 3306-3309, XP012007924, ISSN: 0734-211X, p. 3307-3308, NA=1.2, n(prism)=1.5 < n(immersion)=1.51.

XP-002330079 "Water-Based 193nm Immersion Lithography" 'Online!', Bruce Smith, Jan. 28, 2004, XP 002329291 retrieved from the Internet: URL:http//www.sematech.org/resources/litho/meetings/immersion/20040128/presentations/06%20rit20%microstepper%20efforts_Smith.pdf> retrieved on May 24, 2005!, p. 14: NA > 1, lens material: SiO2, p. 22: n(liquid lens) > 1.6 > n(SiO2).

Burnett et al., "High Index Materials for 193 nm immersion Lithography", International Symposium on Immersion & 157 nm Lithography, Feb. 8, 2004, pp. 3, figure 1.

Dammel et al., "193 nm Immersion Lithography—Taking the Plunge", Journal of Photopolymer Science and Technology, vol. 17 No. 4, pp. 587-607 (2004).

Kawata et al., "Fabrication of 0.2mm Fine Patterns Using Optical Projection Lithography With an Oil Immersion Lens", Japanese Journal of Applied Physics, Japan Society of Applied Physics, Tokyo, Japan, vol. 31 No. 12B, Part 1, Dec. 1, 1992, pp. 4174-4177.

Owa et al., "Immersion Lithography; its Potential Performance Issues", Proceeding of the SPIE, SPIE, Bellingham, VA, vol. 5040 No. 1, Feb. 28, 2003, pp. 724-733.

Lammers, "'Doped water' could extend 193-nm immersion litho," *EETimes Online*, http://ww.eetimes.com/showArticle.jhtml?articleID=18310517, 2 pages (Jan. 28, 2004).

Saurei et al., "Design of an autofocus lens for VGA ¼-inch CCD and CMOS sensors," *SPIE International Symposium: Optical Systems Design*, St. Etienne, France, 1 page (2003).

* cited by examiner

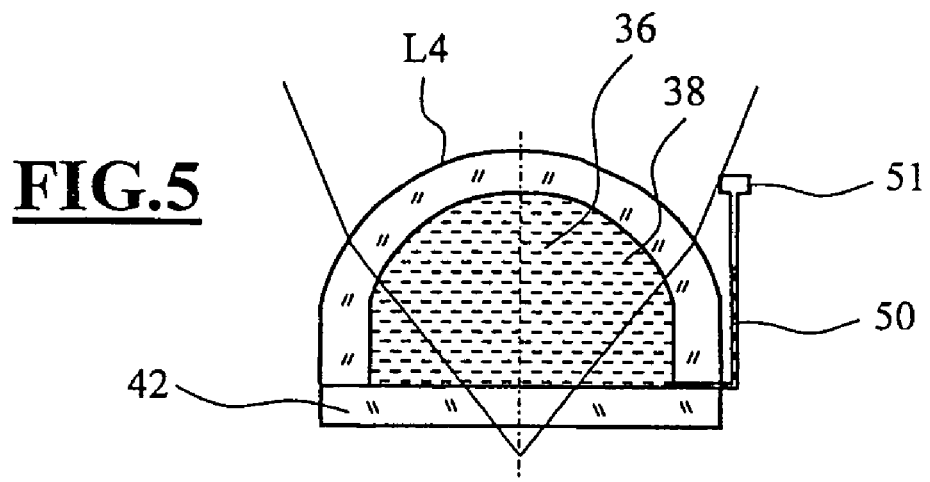
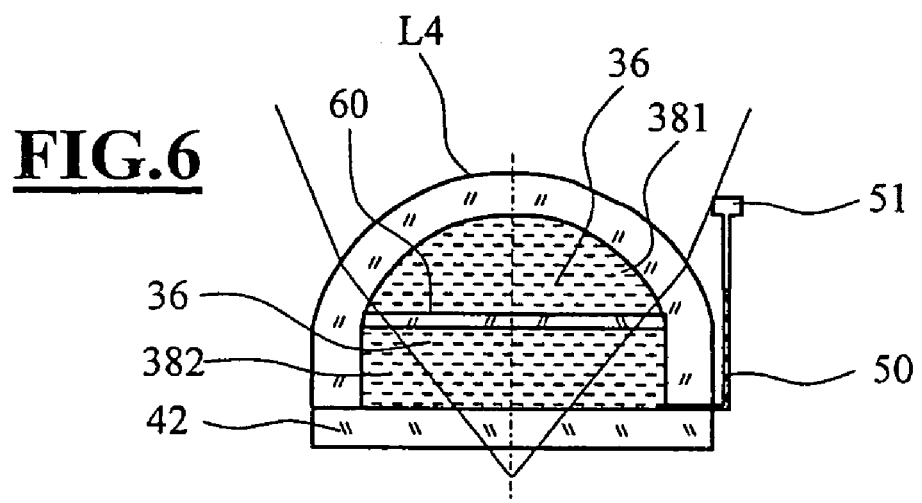
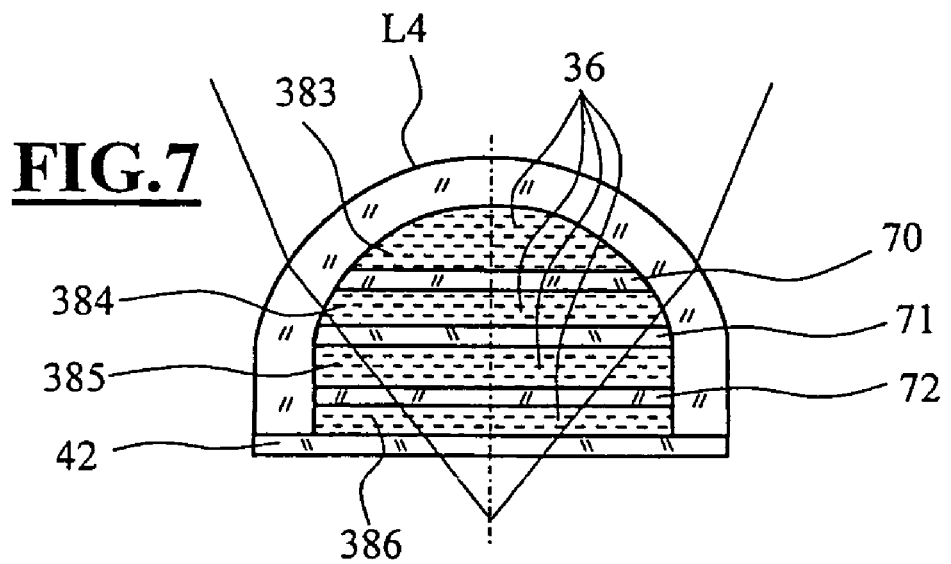

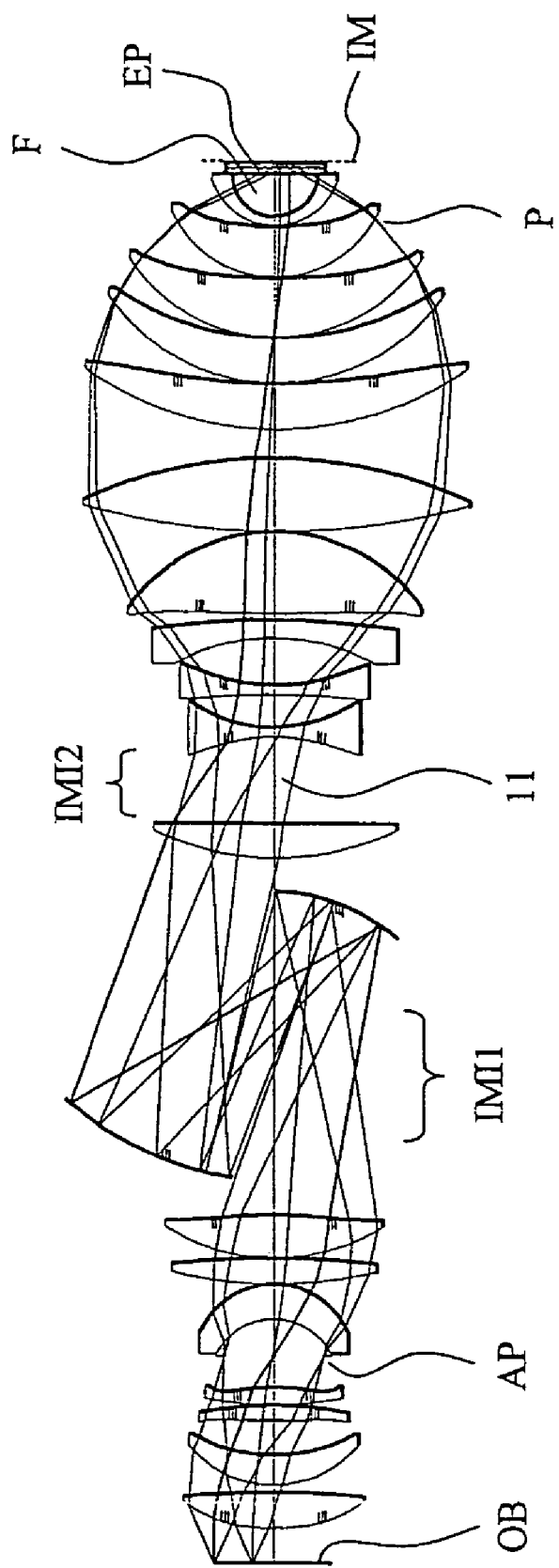

ARRANGEMENT OF OPTICAL ELEMENTS IN A MICROLITHOGRAPHIC PROJECTION EXPOSURE APPARATUS

CROSS-REFERENCE TO RELATED APPLICATIONS

This is a continuation in part of international application PCT/EP2004/014728 filed on Dec. 27, 2004, which claims benefit of U.S. 60/568,006 filed May 4, 2004 and of U.S. 60/612,823 filed on Sep. 24, 2004, and a continuation in part of PCT application number PCT/EP2004/014219, filed on Dec. 14, 2004, which claims benefit of U.S. 60/530,623, filed on Dec. 19, 2003, of U.S. 60/544,967 filed on Feb. 13, 2004, of U.S. 60/568,006 filed on May 4, 2004, U.S. 60/591,775 filed on Jul. 27, 2004, of U.S. 60/592,208 filed Jul. on 29, 2004 and of U.S. 60/612,823 filed on Sep. 24, 2004. The complete disclosure of both international applications PCT/EP2004/014728 and PCT/EP2004/014219 are incorporated herein by reference.

BACKGROUND OF THE INVENTION

1. Field of the Invention

The invention relates to an arrangement of optical elements in a microlithographic projection exposure apparatus, a projection objective with such an arrangement, a projection exposure apparatus with such an arrangement or such a projection objective and a method for the production of microstructured components with such an apparatus.

2. Description of Related Art

Integrated electrical circuits and other microstructured components are conventionally produced by applying a plurality of structured layers to a suitable substrate, which, for example, may be a silicon wafer. In order to structure the layers, they are first covered with a photoresist which is sensitive to light of a particular wavelength range, for example light in the deep ultraviolet (DUV) spectral range. The wafer coated in this way is subsequently exposed in a projection exposure apparatus. A pattern of diffracting structures, which is arranged on a mask, is projected onto the photoresist with the aid of a projection objective. Since the imaging scale is generally less than 1, such projection objectives are also often referred to as reduction objectives.

After the photoresist has been developed, the wafer is subjected to an etching process so that the layer becomes structured according to the pattern on the mask. The remaining photoresist is then removed from the other parts of the layer. This process is repeated until all the layers have been applied to the wafer.

One of the essential aims in the development of projection exposure apparatuses used for production is to be able to lithographically define structures with smaller and smaller dimensions on the wafer. Small structures lead to high integration densities, and this generally has a favorable effect on the performance of the microstructured components produced with the aid of such systems.

The size of the structures, which can be defined, depends primarily on the resolution of the projection objective. Since the size of the structure, which can still be resolved with a projection objective, is proportional to the wavelength of the projection light, one way of improving the resolution is to use projection light with shorter and shorter wavelengths. The shortest wavelengths used at present are in the deep ultraviolet (DUV) spectral range, namely 193 nm and 157 nm.

Another way of improving the resolution is based on the idea of introducing an immersion liquid with a high refractive index into an intermediate space, which remains between a last lens on the image side of the projection objective and the photoresist. Projection objectives which are designed for immersed operation, and which are therefore also referred to as immersion lenses, can achieve numerical apertures of more than 1, for example 1.3 or 1.4. The immersion, moreover, not only allows high numerical apertures and therefore improved resolution but also has a favorable effect on the depth of focus. The greater the depth of focus is, the less stringent are the requirements for exact axial positioning of the wafer in the image plane of the projection objective.

SUMMARY OF THE INVENTION

It is an object of the invention to provide an arrangement of optical elements for a microlithographic projection exposure apparatus so that a high numerical aperture is possible.

The arrangement of optical elements according to the invention is located in a microlithographic projection exposure apparatus, particularly in a projection objective of a microlithographic projection exposure apparatus. The expressions "projection objective" and "projection lens" will be used as synonyms hereinafter. The arrangement according to the invention comprises a rigid first optical element, a rigid second optical element with a first optical surface and a second optical surface on opposite sides and a first liquid. Rigid in this context means that the optical elements have a definite shape, which does not change except for the very small changes, caused by thermal expansion or by mechanical stress etc. The first optical element has a concave optical surface. The first side of the second optical element is facing the concave optical surface of the first optical element. The first liquid is at least partially filling the space between the first optical element and the second optical element.

The first liquid is serving as an optical element the optical surfaces of which are defined by the adjacent surfaces of the first optical element and the second optical element, respectively. By way of this the first liquid, which has no shape on its own exhibits properties of an optical element with a definite shape. For example the first liquid can serve as a lens and is sometimes also referred to as "liquid lens" hereinafter.

Preferably the index of refraction of the first liquid is higher than or equal to the index of refraction of the first optical element. Furthermore it is preferred that the index of refraction of the first liquid is smaller than or equal to the index of refraction of the second optical element.

In preferred embodiments the first optical element is made of fused silica or of a crystal material, especially calcium fluoride. Fused silica has no intrinsic birefringence. Calcium fluoride has only a small intrinsic birefringence at the light wavelengths, which are of interest with respect to the invention. The intrinsic birefringence may negatively affect the accuracy of the optical projection, which can be achieved with the arrangement according to the invention.

The second optical element may have at least one planar optical surface. In particular the second optical surface of the second optical element is of planar form. In a preferred embodiment the second optical element is formed as a planar-parallel plate.

The second optical element is preferably made of a crystal material with a crystal lattice. In particular the second optical element has an element axis that points in a principal crystallographic direction. In case of a second optical element with a rotational symmetry the element axis coincides with the axis of rotational symmetry. In case of a second optical element with a plane surface the element axis coincides with the surface normal. Suitable materials for the second optical element are e.g. lithium fluoride, sapphire or spinel. At a wavelength of 193 nm, lithium fluoride has a refractive index of 1.4432 whereas the refractive index of water is 1.4366.

Spinel (Magnesium Aluminum Oxide, $MgAl_2O_4$) is a cubic crystal with a refractive index of approximately 1.87 at 193 nm wavelength. There are several variants distinguished by their Al/Mg ratio and the atom sites (inverse spinel). The intrinsic birefringence was measured to be approximately 52 nm/cm at a wavelength of 193 nm.

In a preferred embodiment the second optical element comprises a stack of planar-parallel plates. The stack may comprise planar-parallel plates of crystal material with a crystal lattice, the planar-parallel plates being cut parallel to different crystallographic planes. In addition or as an alternative the stack may comprise planar-parallel plates of crystal material with a crystal lattice, the planar-parallel plates being cut parallel to equivalent crystallographic planes. In this case the crystal lattices of the planar-parallel plates are oriented in the stack relative to each other with an angle of rotation about an axle perpendicular to the cutting planes. With such stack constructions it is possible to reduce the overall effects caused by the intrinsic birefringence of the crystal material of the second optical element. This kind of compensation of the effects caused by intrinsic birefringence is sometimes referred to as "clocking".

E.g. due to absorption of light the temperature of the first liquid may vary. Because of thermal expansion effects the volume of the first liquid may vary according to the temperature variation. If the space between the first optical element and the second optical element is formed as a completely closed cavity the pressure within this cavity may change substantially. This could cause an undesired deformation of the first or second optical element or even a leakage. Especially for this reason it is of advantage if the space between the first optical element and the second optical element is vented. In particular the space between the first optical element and the second optical element is hydraulically interconnected to a venting tank.

Further problems might arise due to thermal driven convection of the first liquid in the space between the first and the second optical element. Convection in this context means that there is a flow of liquid following a closed loop within the space between the first and second optical element. The convection may have a negative effect on the optical properties of the first liquid. Reducing the volume of the first liquid within which the convection may occur can reduce the negative impact of convection or even prevent convection. Accordingly, in one embodiment at least one intermediate optical element is arranged in the space between the first optical element and the second optical element. The intermediate optical element is preferably made of a crystal material with a crystal lattice. In particular the intermediate optical element may have an element axis that points in a principal crystallographic direction. In one embodiment the element axes of the second optical element and of the intermediate optical element point in different principal crystallographic directions. In another embodiment the element axes of the second optical element and of the intermediate optical element point in equivalent principal crystallographic directions. In this embodiment the crystal lattices of the second optical element and the intermediate optical element are oriented relative to each other with an angle of rotation about the element axes. By way of this negative effects due to intrinsic birefringence can be reduced.

The negative effects of convection and of intrinsic birefringence can be further reduced, if a plurality of intermediate optical elements is arranged in the space between the first optical element and the second optical element, the intermediate optical elements being made of a crystal material with a crystal lattice. Preferably at least some of the intermediate optical elements have respective element axes that point in different principal crystallographic directions. In addition or as an alternative it is also possible that at least some of the intermediate optical elements have element axes that point in equivalent principal crystallographic directions. In this case the crystal lattices of the intermediate optical elements are oriented relative to each other with an angle of rotation about the element axes.

In a preferred embodiment there is a second liquid adjacent to the second optical surface of the second optical element. The second liquid may serve as an immersion liquid for immersion lithography. The first liquid and the second liquid may consist of the same material.

The invention also relates to a microlithographic projection objective with a plurality of optical elements arranged between an object plane and an image plane. The projection objective comprises an arrangement of optical elements as described before.

In a preferred embodiment of the projection objective the concave optical surface of the first optical element is located at the image side of the first optical element. The image side of the first optical element is the side which is closer to the image plane than to the object plane. The second optical element is preferably located on the image side of the first optical element. It is of advantage, if the second optical element is situated closer to the image plane than any other rigid optical element of the projection objective. In other words the second optical element is preferably the last rigid optical element on the image side of the projection objective. This design allows high numerical apertures on the image side of the projection objective. Preferably the image side numerical aperture of the projection objective has a value of at least 1.0.

The projection objective may be a catadioptric projection objective. In particular at least two of the optical elements may be mirrors.

In preferred embodiments the projection objective is designed for operating at a wavelength below 200 nm. In particular the projection objective is designed for operating at a wavelength of 193 nm or 157 nm.

The invention relates also to a microlithographic projection exposure apparatus with a plurality of optical elements comprising the arrangement of optical elements mentioned before. Furthermore the invention relates to a microlithographic projection exposure apparatus comprising an illumination system and the mentioned projection objective, which projects an object onto a substrate.

The method according to the invention relates to the microlithographic production of a micro-structured component by means of such a microlithographic projection exposure apparatus.

As disclosed herein before the projection objective or projection lens can be designed so that the immersion liquid is convexly curved towards an object plane of the projection objective during immersed operation. This can be achieved, for example, if the immersion liquid is directly adjacent to a concavely curved surface on the image side of the last optical element on the image side during immersed operation. This provides a kind of "liquid lens", the advantage of which is primarily that it is very cost-effective. A calcium fluoride crystal, which is very expensive, has hitherto mainly been used as a material for the last imaging optical element on the image side in projection exposure apparatuses which are designed for wavelengths of 193 nm. The calcium fluoride crystal becomes gradually degraded owing to the high radiation intensities which occur in this last imaging optical element on the image side, which in the end makes it necessary to change it. A protective plate which seals the liquid lens at the bottom, and which may for example consist of LiF, may also be arranged between such a liquid lens and a photosensitive layer to be exposed.

With respect to lenses made from fused silica or calcium fluoride, which are established for microlithography projection objectives with the operating wavelengths of 248 nm, 193 nm, 157 nm, liquids with an index of refraction, for example, $n_F$=1.6, $n_F$=1.65 or $n_F$=1.8 are suitable.

There is a corresponding result for other lens materials known for the deep UV (DUV) and vacuum UV, such as fluoride crystals $BaF_2$, $SrF_2$, LiF, NaF and others.

Although there are many developments of immersion liquids for applications in microlithography, it is clear at least in principle that $H_2SO_4$ (sulfuric acid), $H_3PO4$ (phosphoric acid) and their solutions in $H_2O$ (water) yield adjustable refractive indices of 1.5-1.8 at 193 nm in conjunction with suitable transmission. In addition, the corrosive action of these substances is substantially reduced with the aid of substitution of heavy isotopes, in particular deuterium. This is described inter alia in U.S. Application Ser. No. 60/568,006.

The liquids of the liquid lens and of the immersion at the substrate can then be adapted to various conditions such as:
in the case of the immersion:
rapid movement for step-and-scan
contact with materials of the wafer such as resist
contact with air
cleaning requirements for wafer processing after exposure
in the case of the liquid lens:
contact with material of the adjacent solid lens
and be selected, accordingly.

The effect of increasing the accessible numerical aperture NA caused by the liquid lens with high refractive index $n_F$ becomes greatest when said lens is the last curved element on the image side.

Substantially hemispherical last lenses have proved in this case to be advantageous, since then the angle of incidence of the light varies relatively slightly over the lens surface and remains close to the normal to the curved surface. The critical angle of total reflection is thus effectively avoided.

The inventors have established that the solid lens preceding the liquid lens according to the invention and defining the object-side surface of the liquid lens should be a meniscus lens whose center thickness (THICKNESS in accordance with the tables) is smaller than the difference of the radii of curvature (RADIUS) of the two lens surfaces. Such a meniscus lens having negative refractive power in the paraxial region makes a transition in part to an action of positive refractive power in the outer region where beams strike more steeply, that is from further outside, than the normal to the surface.

Preferably the refractive index of the last surface on the image side is at least approximately the same as the refractive index of the immersion liquid. Although this measure does not prevent the immersion liquid from chemically attacking a last surface on the image side of the projection objective, it does reduce the detrimental consequences for the imaging quality. This is because of the closer the ratio of the refractive indices of this surface and of the immersion liquid lies to 1, the less is the refraction at the interface. If the refractive indices were exactly the same, then light would not be refracted at the interface and therefore the shape of the interface would actually have no effect on the beam path. Local deformations on the surface, due to the immersion liquid, could not then affect the imaging quality.

BRIEF DESCRIPTION OF THE DRAWINGS

Other advantages and features of the invention will be found in the following description of the exemplary embodiments, with reference to the drawings in which:

FIG. 5 represents an enlarged detail of the end on the image side of a projection objective according to an embodiment dealing with the problem of thermal expansion of the immersion liquid;

FIG. 6 represents an enlarged detail of the end on the image side of a projection objective according to an embodiment dealing with the problem of convection within the immersion liquid;

FIG. 7 represents an enlarged detail of the end on the image side of a projection objective according to a further embodiment dealing with the problem of convection within the immersion liquid;

FIG. 9 represents a detailed meridian section of a design of a further embodiment of a projection objective according to the invention.

DETAILED DESCRIPTION OF THE INVENTION

Figure 1:
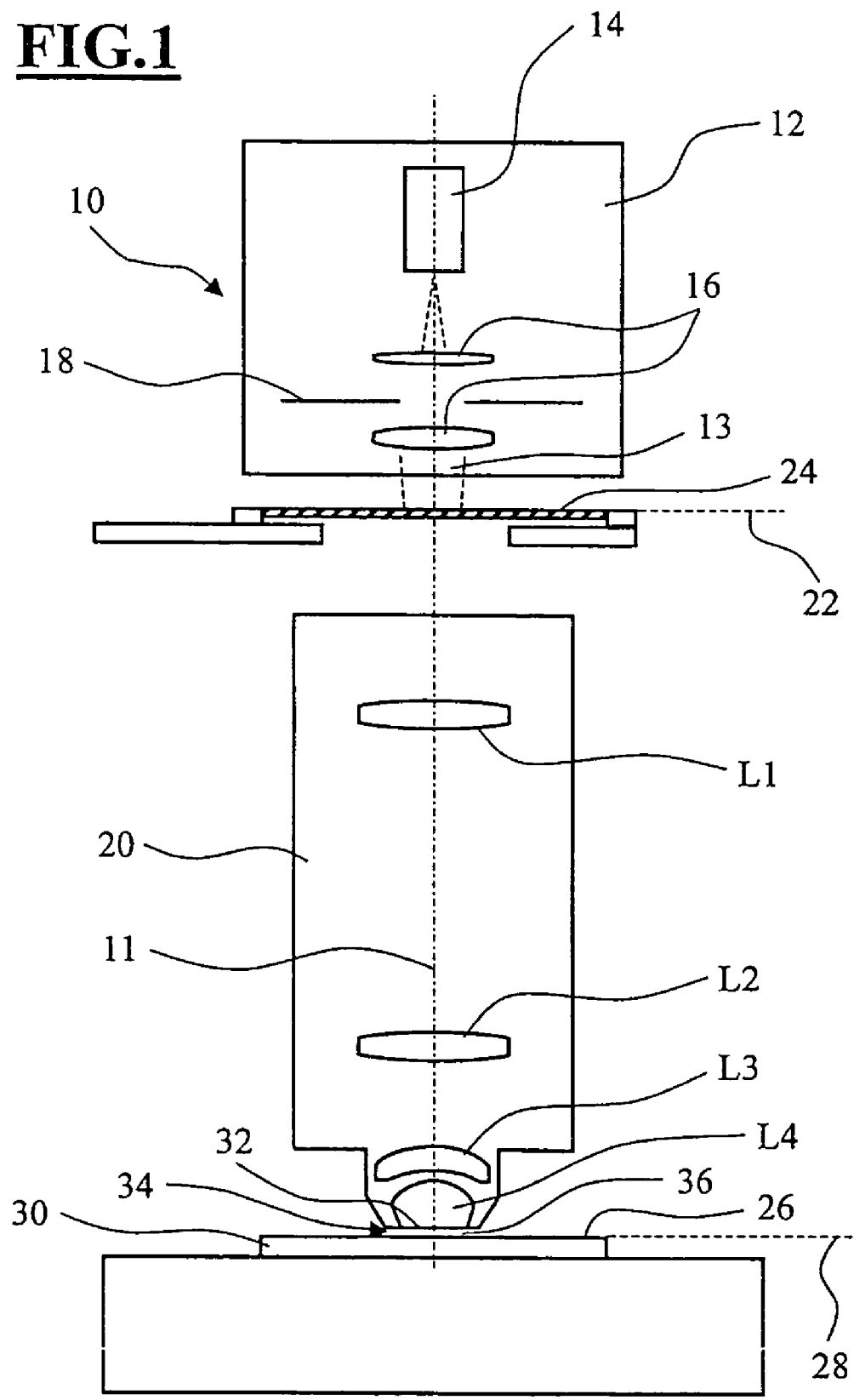
FIG. 1 represents a meridian section through a projection exposure apparatus according to a first exemplary embodiment of the invention, in a highly simplified schematic representation, which is not true to scale.

FIG. 1 shows a meridian section through a microlithographic projection exposure apparatus, denoted overall by 10, according to a first exemplary embodiment of the invention in a highly simplified schematic representation. The projection exposure apparatus 10 has an illumination device 12 for the generation of projection light 13, which inter alia comprises a light source 14, illumination optics indicated by 16 and a diaphragm 18. In the exemplary embodiment, which is represented, the projection light has a wavelength of 193 nm.

The projection exposure apparatus 10 furthermore includes a projection objective (projection lens) 20 which contains a multiplicity of lens elements, only some of which denoted by L1 to L4 are represented by way of example in FIG. 1 for the sake of clarity. The expressions "projection objective" and "projection lens" have the same meaning in the context of this application. The lens elements are arranged along an optical axis 11 of the projection objective 20. The projection objective 20 is used to project a reduced image of a reticle 24, which is arranged in an object plane 22 of the projection objective 20, onto a photosensitive layer 26, which is arranged in an image plane 28 of the projection objective 20 and is applied to a support 30. The photosensitive layer may, for example, be a photoresist, which becomes chemically modified when it is exposed to projection light with a particular intensity.

Figure 8:
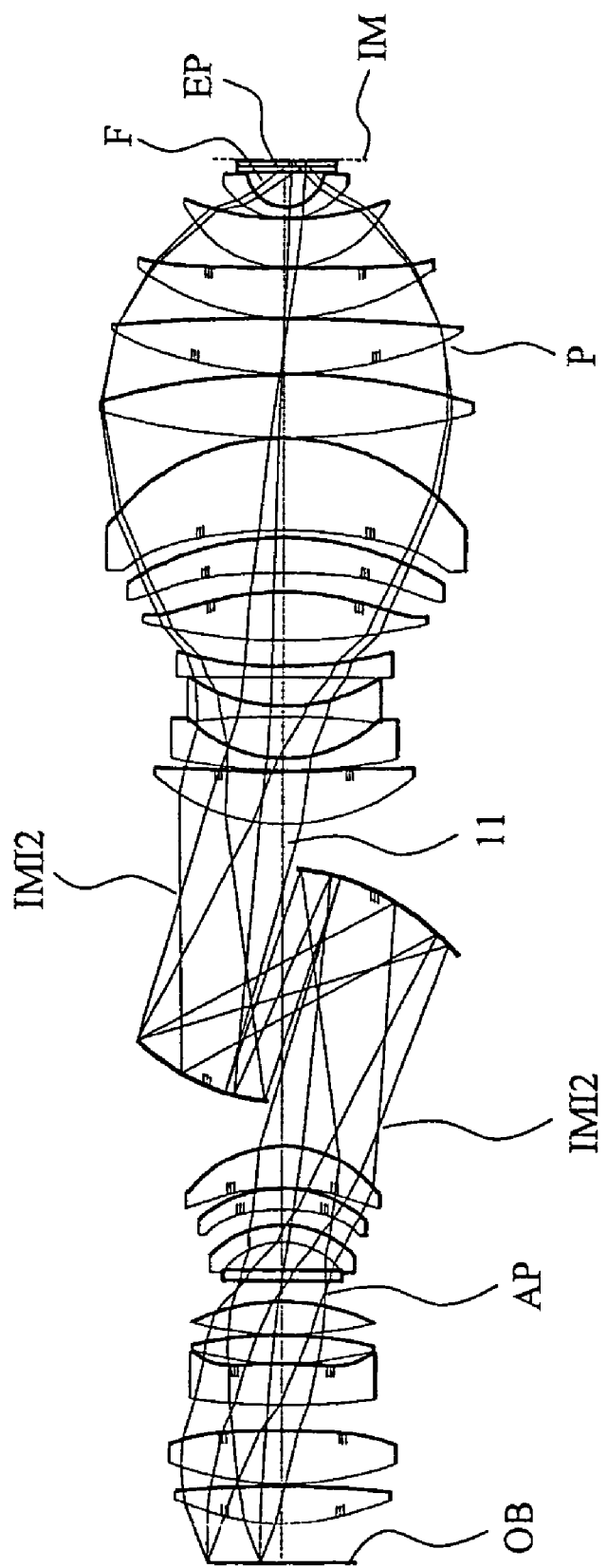
FIG. 8 represents a detailed meridian section of a design of an embodiment of a projection objective according to the invention.

In the exemplary embodiment, which is represented, the last lens element L4 on the image side is a high-aperture, comparatively thick convexo-plane lens element, which is made of a calcium fluoride crystal. The term "lens element", however, is in this case also intended to include a plane-parallel plate. A plane surface 32 on the image side of the lens element L4 together with the photosensitive layer 26 lying opposite delimits an intermediate space 34 in a vertical direction, which is filled with an immersion liquid 36. With an appropriate layout of the projection objective 20, the immersion liquid 36 makes it possible to increase its numerical aperture in comparison with a dry objective and/or improve the depth of focus. Since immersion objectives for microlithography projection exposure apparatuses to this extent are known, further details will not be explained in this regard. However, possible designs of the projection objective 20 are shown in FIGS. 8 and 9.

In the exemplary embodiment, which is represented, the immersion liquid 36 consists of highly pure heavy water ($D_2O$).

Figure 2:
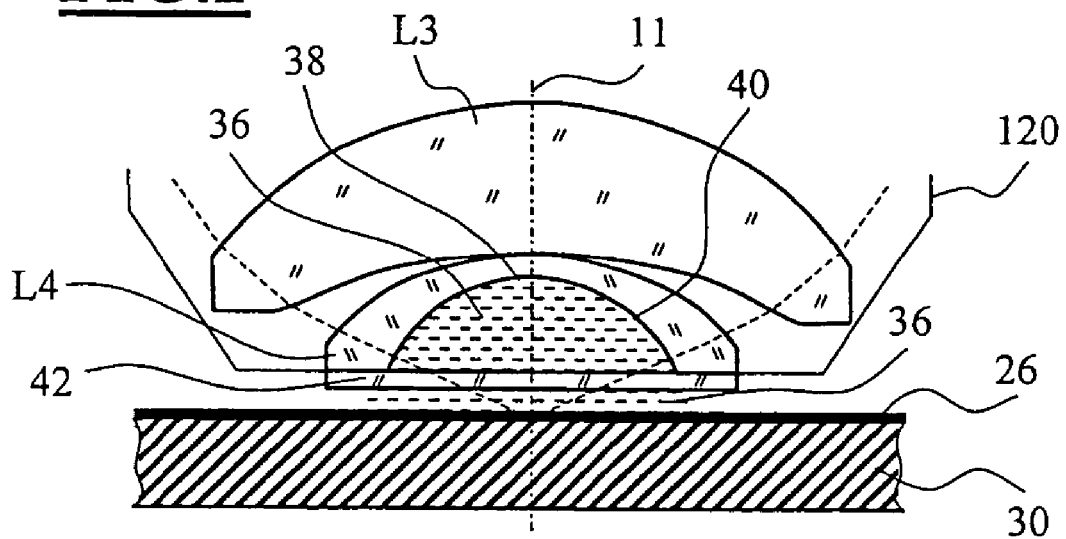
FIG. 2 represents an enlarged detail of the end on the image side of a projection objective, which is part of the projection exposure apparatus as shown in FIG. 1.

FIG. 2 shows an enlarged detail of an end on the image side of a projection objective denoted by 120, according to an exemplary embodiment in which the lens element L4 is designed as a convexo-concave meniscus lens. The immersion liquid 36 extends up to the concave surface 40 of the lens element L4 and is itself therefore convexly curved on the object side. The resulting "liquid lens" has the advantage, inter alia, that it can withstand heavy radiation loads particularly well in the vicinity of the end on the image side and, furthermore, it can be changed in a comparatively straight-forward and cost-effective way.

In order to prevent the immersion liquid 36 from being contaminated and flowing out of the cavity formed below the lens element L4, the liquid lens formed by the heavy water is sealed on the image side by a plane-parallel plate 42 made of LiF. In other words, the lens element L4 and the planar-parallel plate 42 are forming a closed cavity 38, which is filled with the immersion liquid 36.

FIGS. 3 to 7 show enlarged details of the end on the image side of the projection objective 120, according to further embodiments in which the lens element L4 is designed as a convexo-concave meniscus lens. For reasons of simplicity these Figures concentrate on the region of the lens element L4 and the planar-parallel plate 42. The lens element L4 may consist of a material showing no or only a small intrinsic birefringence at the wavelength of the projection light, e.g. 193 nm or 157 nm. For example quartz or calcium fluoride are suitable materials. The planar-parallel plate may consist of a material of high refractive index, preferably spinel. In all embodiments shown in FIGS. 3 to 7 the closed cavity 38 formed by the lens element L4 and the planar-parallel plate 42 is filled with the immersion liquid 36. As an alternative it is although possible to fill the cavity 38 with a liquid different from an immersion liquid, which is used to fill the space between the lens element L4 and the photosensitive layer 26.

Figure 3:
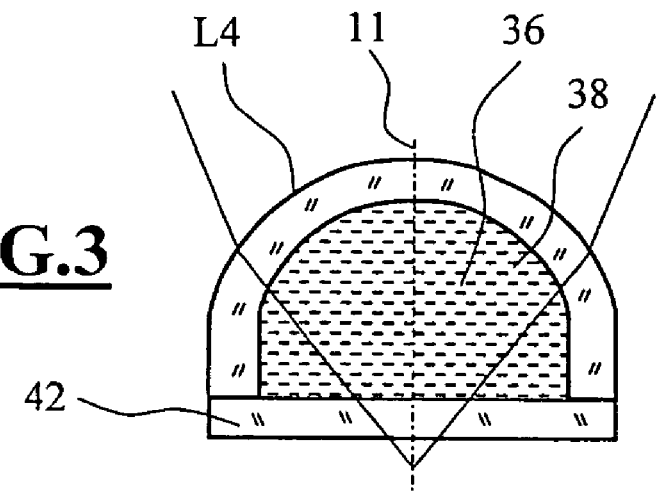
FIG. 3 represents an enlarged detail of the end on the image side of a projection objective according to a further embodiment with a planar-parallel plate made from a crystal material.

FIG. 3 represents an embodiment with a planar-parallel plate 42 made from a crystal material. The planar-parallel plate 42 is preferably cut parallel to a principal crystallographic direction. To avoid high values of intrinsic birefringence the thickness of the planar-parallel plate 42 should be quite small, e.g. about 1 mm. However at small thicknesses of the planar-parallel plate 42 problems with respect to the mechanical stability might arise. This can be overcome by the embodiment shown in FIG. 4.

Figure 4:
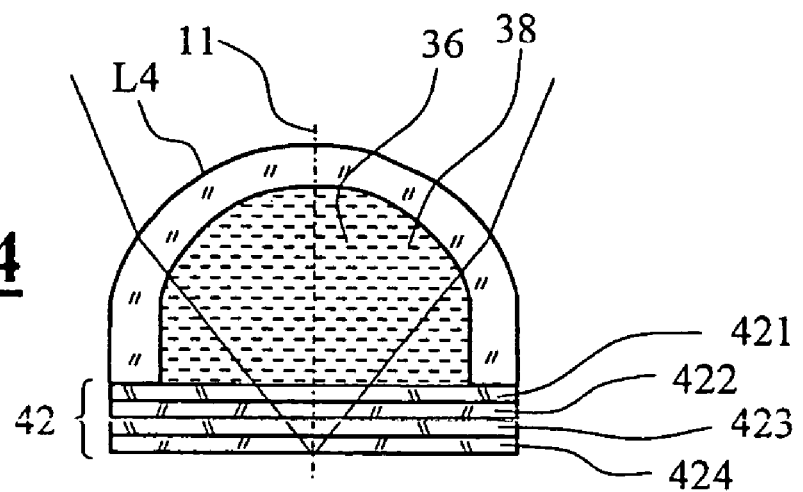
FIG. 4 represents an enlarged detail of the end on the image side of a projection objective according to an embodiment with a planar-parallel plate having a small intrinsic birefringence.

FIG. 4 represents an embodiment with a planar-parallel plate 42 with small intrinsic birefringence. The overall birefringence of the planar-parallel plate 42 is reduced by composing the planar-parallel plate 42 in a direction parallel to the optical axis 11 of the projection objective 20 of several thin planar-parallel plates 421, 422, 423 and 424 made from crystal materials with different crystallographic orientations. The planar-parallel plates 421, 422, 423 and 424 are preferably cut parallel to the principal crystallographic directions. Good results can be achieved with combinations of planar-parallel plates 421, 422, 423 and 424 cut parallel to a crystallographic (100)-plane or to a crystallographic (111)-plane, respectively. Such planar-parallel plates will be called (100)- or (111)-planar-parallel plates hereinafter. In the embodiment of FIG. 4 the planar-parallel plate 42 is composed of (100)-planar-parallel plates 421 and 423 and of (111)-planar-parallel plates 422 and 424.

The (100)-planar-parallel plates 421, 423 and the (111)-planar-parallel plates 422, 424 may be of different thickness, the preferred thickness ratio being 3:2. Furthermore the (100)-planar-parallel plates 421, 423 are preferably rotated with respect to each other about an axis perpendicular to the cutting planes and so are the (111)-planar-parallel plates 422, 424. The rotational axis preferably coincides with the optical axis 11 of the projection objective 20. Preferred angles of rotation are 45° with respect to the (100)-planar-parallel plates 421, 423 and 60° with respect to the (111)-planar-parallel plates 422, 424.

In the embodiment of FIG. 4 the planar-parallel plate 42 is preferable composed of a (100)-planar-parallel plate 421 of thickness 2 mm rotated 0° about the optical axis 11 of the projection objective 20 with respect to an arbitrary reference direction, a (111)-planar-parallel plate 422 of thickness 3 mm rotated 0°, a (100)-planar-parallel plate 423 of thickness 2 mm rotated 45° and a (111)-planar-parallel plate 424 of thickness 3 mm rotated 60°. The planar-parallel plates 421, 422, 423 and 424 are arranged in this order, the (100)-planar-parallel plate 421 forming the object side of the planar-parallel plate 42 and the (111)-planar-parallel plate 424 forming the image side of the planar-parallel plate 42. The reverse order of the planar-parallel plates 421, 422, 423 and 424 is also possible. A more detailed description of the compensation of intrinsic birefringence is given in US 2004/0105170 A1. The complete disclosure of this document is hereby incorporated.

The intrinsic birefringence of the planar-parallel plate 42 may also be compensated using other known techniques, e.g. applying uniaxial crystals or making use of the effect of layer birefringence.

FIG. 5 represents an embodiment dealing with the problem of thermal expansion of the immersion liquid 36. Most of the presently known immersion liquids with high indices of refraction have also high indices of absorption.

As a first consequence the reduced transmission results in a reduced uniformity. This can be compensated with the help of grey filters. As a rule at least three grey filters are necessary: A first filter should be arranged close to a pupil plane of the projection objective 20. A second grey filter should be arranged close to a field plane of the projection objective 20. A third grey filter should be arranged in an intermediate plane between pupil plane and field plane.

As a second consequence the immersion liquid 36 is warmed up by the absorbed energy. This results in a change of the index of refraction and in a thermal expansion of the immersion liquid 36. The thermal expansion might have the effect of bulging the planar-parallel plate 42. Venting the cavity 38 formed by the lens element L4 and the planar-parallel plate 42 can avoid such a bulging of the planar-parallel plate 42. The venting can be achieved by a venting pipeline 50 coupling the cavity 38 with an expansion tank 51. If the volume of the immersion liquid 36 in the cavity increases due to increasing temperature, immersion liquid 36 is flowing from the cavity to the expansion tank 51. If the volume of the immersion liquid 36 in the cavity 38 decreases due to decreasing temperature, immersion liquid 36 is flowing back from the expansion tank 51 to the cavity 38. By this venting mechanism the pressure of the immersion liquid 36 in the cavity 38 can be kept constant. Because of the small volume of the cavity 38 the venting pipeline 50 and the expansion tank 51 can be built with rather small dimensions. Though not shown in FIG. 4 there might be a further pipeline for filling or emptying the cavity 38.

Another problem might arise due to thermal driven convection of the immersion liquid 36 in the cavity 38. The problem of convection can be reduced with the embodiments shown in FIGS. 6 and 7.

FIG. 6 represents an embodiment dealing with the problem of convection within the immersion liquid 36. Compared to FIG. 5 there is an additional planar-parallel plate 60 separating the cavity 38 into two sub-cavities 381 and 382. The planar-parallel plate 60 may consist of the same material as the planar-parallel plate 42 and is preferably oriented parallel to the planar-parallel plate 42. The influence of the intrinsic birefringence of the planar-parallel plates 42 and 60 can be reduced in an analogous manner as disclosed with respect to the embodiment of FIG. 4. At the preferred value for the distance between the planar-parallel plates 42 and 60 the two sub-cavities 381 and 382 have roughly the same volume. It is not necessary that the sub-cavities 381 and 382 are completely separated by the planar-parallel plate 60. A small interconnection between the sub-cavities 381 and 382 is even of advantage to avoid overpressure problems and to make both sub-cavities 381 and 382 accessible for venting and in order to fill them with the immersion liquid 36.

FIG. 7 represents a further embodiment dealing with the problem of convection within the immersion liquid 36. Within the cavity 38 filled with the immersion liquid 36 several planar-parallel plates 70, 71 and 72 are arranged in parallel orientation relative to the planar-parallel plate 42 and relative to each other. By way of this the cavity 38 is subdivided into four sub-cavities 383, 384, 385 and 386 of roughly the same volume each. Preferably the planar-parallel plates 70, 71, 72 and 42 are of similar material and orientation as the planar-parallel plates 421, 422, 423 and 424. As a result there is a similar compensation of intrinsic birefringence at the embodiment of FIG. 7 as already descript with respect to FIG. 4.

No venting mechanism is shown in FIG. 7. As the sub-cavities 383, 384, 385 and 386 are quite small in many cases no venting is necessary. However, it is also possible to supply the embodiment of FIG. 7 with a venting mechanism.

The concepts of the different embodiment can also be combined with each other so that the drawings only represent a subset of the possible embodiments.

In all embodiments shown in the Figures a planar-parallel plate is arranged on the image side of the lens element L4 as a limitation of the cavity 38. However, it is also possible to use an otherwise formed optical element instead of the planar-parallel plate, e.g. an optical element with at least one arcuate optical surface.

Complete designs of the projection objective 20 are shown in FIGS. 8 and 9. FIGS. 8 and 9 respectively represent a detailed meridian section of a design of an embodiment of a projection objective 20 according to the invention.

In FIGS. 8 and 9 marginal and principal rays are depicted for the object points nearest and furthest from the axis. Aspheric surfaces are marked twice with 3 lines at the contour.

The optical axis 11 or the axis of symmetry of the curvatures of the surfaces is marked by dots and dashes.

In each case OB denotes the object plane. This corresponds to the surface (SURF) 0 in the tables. IM denotes the image plane and corresponds in each case to the surface of the highest number in the tables.

F respectively denotes the liquid lens according to the invention.

EP denotes an end plate.

IMI1 and IMI2 are the intermediate images.

AP denotes the position of the system aperture at which an adjustable diaphragm can be arranged and will also be referred to as diaphragm plane.

P denotes the pupil in an image-side objective part.

The embodiments shown in FIGS. 8 and 9 are designed for the operating wavelength 193.4 nm (ArF Excimer Laser) and reduce by 1:4—without limiting the invention thereto.

Tables 1a and 2a respectively give the design data for the FIGS. 8 and 9, respectively. Tables 1b and 2b respectively specify the aspheric data of the aspheric lens and mirror surfaces, which are identified in the drawings by three primes. The illustration is made using a commercial Optic-Design-Software.

In each embodiment shown in FIGS. 8 and 9 the objective comprises an object-side objective part, an image-side objective part and an intermediate objective part. The object-side objective part is situated at the object-side end of the objective. The image-side objective part is situated at the image-side end of the objective. The intermediate objective part is situated between the object-side objective part and the image-side objective part. In the embodiments the object-side objective part and the image side objective part are purely refractive. The intermediate objective part is catoptrical.

In the embodiment of FIG. 8 the value of the numerical aperture NA=1.4. The liquid of the lens F and the immersion have the same refractive index $n_F=n_1=1.65$. The material of the solid lenses is fused silica with an index of refraction $n_L=1.56$.

The distance from the object plane OB to the image IM is 1250 mm and thereby a common value.

The image field is 26 mm×5.5 mm, decentered by 4.66 mm. However, the correction state yields an RMS wave front error of this image field of approximately 10-20 per mil of the operating wavelength.

The lenses of the object-side objective part and the image side objective part are rotationally symmetrical in relation to a common axis of symmetry, with the two mirrors of the intermediate objective part certainly being curved in an axially symmetrical fashion, but being edged asymmetrically.

The design of the objective will now be described in more detail with respect to the embodiment of FIG. 8. Most of the features are also present at the embodiment of FIG. 9, but will only be explained in some detail with respect to FIG. 8.

The object-side objective part comprises an accessible diaphragm plane AP with the stop-down system diaphragm. Preceding the diaphragm plane AP there is a particularly strongly modulated aspheric (surface 7 of table 1a/b). Subsequent to the diaphragm plane AP there is a meniscus lens which is concave on the side of the diaphragm plane AP (surfaces 15, 16 in table 1a).

The intermediate objective part is designed catoptrical and comprises two concave mirrors (surfaces 23, 24 in table 1a).

The image-side objective part subsequent to the second intermediate image IMI2—the intermediate images are not corrected and do not form an image plane—begins with a positive lens group of single-lens design, forms a waist with a number of negative lenses, and has a positive lens group with many members which forms a massive belly.

Strongly modulated aspherics (inter alia, surface 36 in table 1a/b) are significant in the initial region of the positive lens group where the diameters of the light bundle and of the lenses are increasing. The middle of the belly is formed by the lens of greatest diameter (surface 41/42 in table 1a, height (SEMIDIAM, half lens diameter) 160 mm). The production of lithographic projection objectives is very economical with this lens diameter. The pupil P of the image-side objective part is, in a fashion typical of the objectives according to the invention, following this largest lens in the convergent beam path.

It has been established that a plane-parallel plate, which separates the liquid lens F and the immersion, is not critical for the optical function. This holds in particular when the refractive index of the plan-parallel plate is greater than the refractive indices $n_F$ of the liquid lens F and $n_1$ of the immersion. FIG. 8 shows an embodiment with such an end plate EP of refractive index $n_{EP}$=1.80. By adapting the thickness, it can easily be exchanged for a plate made from sapphire with $n_{EP}$=1.92.

The embodiment of FIG. 9 for the first time exhibits an objective with the numerical aperture NA=1.6 being greater than the refractive index $n_L$ of the solid lenses used. The solid lenses are made from fused silica with $n_L$=1.56. The refractive index of the liquid lens F is $n_F$=1.80. Also this embodiment is corrected much better than in a diffraction-limited fashion, its image field being 20 mm×4 mm at a decentering of 4.375 mm. The RMS wavefront error is below a tenth of the operating wavelength 193.4 mm.

Here, as well, the object-side objective part is purely refractive. It includes the accessible and stop-down diaphragm plane AP and strong aspherics preceding the diaphragm plane AP. Here these aspherics are two lenses of lesser refractive power but stronger modulation of the aspheric shape deviation, surfaces 6 and 9 in table 2a/b. Arranged subsequent to these aspherics is a likewise strongly curved meniscus lens, surfaces 11, 12 in table 2a.

The intermediate objective part is once again a prolate catadioptric objective with two concave mirrors, similar to FIG. 8, but now with a positive field lens (surfaces 21, 22 in table 2a) preceding the second intermediate image IMI2.

The positive field lens replaces the positive first lens group present in FIG. 8 in the image-side objective part.

The image-side objective part thus begins with a negative lens group and forms a belly with a multi-lens positive lens group. In the embodiment of FIG. 9 the greatest lens diameter is reached with almost 166 mm at the lenses 31/32 and 33/34 as can be seen in table 2a. A plurality of positive meniscus lenses which are concave in relation to the image plane IM is arranged subsequent to these lenses. The pupil P of the image-side objective part lies in the region of these meniscus lenses.

The embodiment of FIG. 9 and table 2a/b comprise a 3.0 mm thick end plate EP made from sapphire. The liquid lens F is now formed between the surfaces 42, 43 of table 2a. Their thickness is 40.2 mm, the radius is 38.1 mm. The thickness is thus 105% of the radius.

It has thus been shown that liquid lenses F of high refractive index permit the design of high-quality projection objectives with extreme numerical apertures.

Multivarious approaches and instructions are thus given to the person skilled in the art in order to use this teaching for further developing different kinds of known approaches in designing objectives.

TABLE 1a

| SURF | RADIUS | THICKNESS | MATERIAL | INDEX | SEMIDIAM. |
|---|---|---|---|---|---|
| 0 = OB | ∞ | 35.000000 | | 1.00030168 | 66.000 |
| 1 | ∞ | 0.099980 | | 1.00030168 | 77.003 |
| 2 | 170.078547 | 36.468596 | SIO2V | 1.56078570 | 90.000 |
| 3 | −599.314872 | 2.182511 | | 1.00029966 | 90.000 |
| 4 | 333.623154 | 49.026243 | SIO2V | 1.56078570 | 95.000 |
| 5 | −5357.879827 | 17.783452 | | 1.00029966 | 95.000 |
| 6 | 524.085081 | 39.656864 | SIO2V | 1.56078570 | 76.354 |
| 7 | −372.985082 | 1.020916 | | 1.00029966 | 73.677 |
| 8 | 273.494931 | 25.000000 | SIO2V | 1.56078570 | 75.000 |
| 9 | −304.985535 | 1.000000 | | 1.00029966 | 75.000 |
| 10 | 326.223899 | 32.555959 | SIO2V | 1.56078570 | 75.000 |
| 11 | −194.836449 | 18.000006 | | 1.00029966 | 75.000 |
| 12 | ∞ | 0.000000 | | 1.00029966 | 36.370 |
| 13 | ∞ | 10.000000 | SIO2V | 1.56078570 | 44.778 |
| 14 | ∞ | 24.420303 | | 1.00029966 | 47.596 |
| 15 | −65.482398 | 15.000019 | SIO2V | 1.56078570 | 50.000 |
| 16 | −89.830925 | 12.487606 | | 1.00029966 | 60.000 |
| 17 | −181.375682 | 17.778805 | SIO2V | 1.56078570 | 65.000 |
| 18 | −112.069227 | 1.008243 | | 1.00029966 | 70.000 |
| 19 | −158.283947 | 37.090377 | SIO2V | 1.56078570 | 80.000 |
| 20 | −102.436390 | 0.099969 | | 1.00029966 | 80.000 |
| 21 | ∞ | 40.000000 | | 1.00029966 | 90.389 |
| 22 | ∞ | 209.622700 | | 1.00029966 | 92.498 |
| 23 | −166.136319 | −209.622700 | REFL | 1.00029966 | 150.000 |
| 24 | 173.615104 | 209.622700 | REFL | 1.00029966 | 125.000 |
| 25 | ∞ | 40.000000 | | 1.00029966 | 99.138 |
| 26 | ∞ | 0.104935 | | 1.00029966 | 105.283 |
| 27 | 161.705740 | 39.665166 | SIO2V | 1.56078570 | 110.000 |
| 28 | 338.219127 | 4.220151 | | 1.00029966 | 105.000 |
| 29 | 539.284856 | 10.000000 | SIO2V | 1.56078570 | 95.000 |
| 30 | 115.279475 | 38.192763 | | 1.00029966 | 80.000 |
| 31 | −713.073292 | 10.000000 | SIO2V | 1.56078570 | 80.000 |

TABLE 1a-continued

| SURF | RADIUS | THICKNESS | MATERIAL | INDEX | SEMIDIAM. |
|---|---|---|---|---|---|
| 32 | 153.450259 | 25.766812 | | 1.00029966 | 80.000 |
| 33 | −35457.805610 | 10.000000 | SIO2V | 1.56078570 | 90.000 |
| 34 | 338.447211 | 22.577058 | | 1.00029966 | 90.000 |
| 35 | 488.793543 | 45.370961 | SIO2V | 1.56078570 | 120.000 |
| 36 | −229.090765 | 17.224093 | | 1.00029966 | 120.000 |
| 37 | −813.380443 | 31.337371 | SIO2V | 1.56078570 | 130.000 |
| 38 | −255.856356 | 9.074786 | | 1.00029966 | 135.000 |
| 39 | −397.181958 | 81.335823 | SIO2V | 1.56078570 | 140.000 |
| 40 | −197.104943 | 1.000000 | | 1.00029966 | 155.000 |
| 41 | 616.283620 | 55.915659 | SIO2V | 1.56078570 | 160.000 |
| 42 | −558.051853 | 0.999900 | | 1.00029966 | 160.000 |
| 43 | 297.754439 | 48.959126 | SIO2V | 1.56078570 | 150.000 |
| 44 | −1599.554010 | 1.000000 | | 1.00029966 | 150.000 |
| 45 | 216.813876 | 43.986900 | SIO2V | 1.56078570 | 125.000 |
| 46 | 2513.355923 | 1.000000 | | 1.00029966 | 125.000 |
| 47 | 102.047705 | 42.326072 | SIO2V | 1.56078570 | 88.000 |
| 48 | 258.213934 | 1.000000 | | 1.00029966 | 85.000 |
| 49 | 67.045666 | 10.000000 | SIO2V | 1.56078570 | 52.000 |
| 50 | 33.992537 | 27.639900 | (F) | 1.65000000 | 33.000 |
| 51 | ∞ | 3.000000 | | 1.80000000 | 33.000 |
| 52 | ∞ | 3.000000 | (IMMERS.) | 1.65000000 | 33.000 |
| 53 = IM | ∞ | | | | 33.000 |

TABLE 1b

ASPHERIC CONSTANTS

| SRF | 2 | 5 | 7 | 17 | 19 |
|---|---|---|---|---|---|
| K | 0 | 0 | 0 | 0 | 0 |
| C1 | −6.761238e−08 | −1.339952e−07 | 4.322957e−07 | −1.865717e−07 | 5.694739e−08 |
| C2 | −2.795074e−13 | 8.081896e−12 | 6.638487e−12 | −2.605817e−11 | 1.297663e−11 |
| C3 | −3.419978e−16 | −1.520519e−15 | 1.196137e−15 | −2.223425e−15 | 7.551094e−16 |
| C4 | 3.593975e−20 | 1.158356e−19 | 3.139076e−19 | 4.529397e−19 | −2.801640e−19 |
| C5 | −7.394770e−24 | 8.165985e−24 | −2.103438e−23 | −1.036163e−22 | −1.293839e−24 |
| C6 | 1.067458e−27 | −2.018394e−27 | −2.540248e−27 | −6.085859e−27 | 7.867948e−28 |
| C7 | −9.043542e−32 | 1.252003e−31 | 3.764879e−31 | 4.354732e−30 | 4.763906e−31 |
| C8 | 3.329797e−36 | −2.409824e−36 | −5.551249e−35 | −7.881442e−34 | −4.577122e−35 |

| SRF | 23 | 24 | 28 | 36 | 37 |
|---|---|---|---|---|---|
| K | −0.603427 | −0.236665 | 0 | 0 | 0 |
| C1 | 0.000000e+00 | 0.000000e+00 | −1.724255e−07 | 1.725752e−08 | −8.279489e−08 |
| C2 | −1.058224e−14 | 3.699741e−15 | 4.976445e−12 | 5.471441e−13 | −8.022210e−13 |
| C3 | −1.413269e−19 | −3.750775e−20 | 2.387092e−16 | 1.390990e−16 | 1.431148e−16 |
| C4 | −1.204112e−23 | 5.430640e−23 | 5.525729e−21 | −1.755950e−20 | −5.767930e−21 |
| C5 | 4.963866e−28 | −5.801174e−27 | −6.052665e−24 | 2.625696e−24 | 6.871766e−25 |
| C6 | −2.129066e−32 | 4.279164e−31 | 7.725095e−28 | −1.914617e−28 | −2.240962e−29 |
| C7 | 3.795477e−37 | −1.574698e−35 | −5.045738e−32 | 7.395971e−33 | −3.639715e−34 |
| C8 | −2.918284e−42 | 2.685481e−40 | 1.564423e−36 | −7.980691e−38 | 3.135529e−38 |

| SRF | 39 | 43 | 46 |
|---|---|---|---|
| K | 0 | 0 | 0 |
| C1 | 5.939680e−09 | −2.752287e−08 | −2.413171e−08 |
| C2 | −2.375134e−13 | 4.114456e−13 | 3.695674e−12 |
| C3 | −6.806224e−17 | 2.737675e−17 | −1.621470e−16 |
| C4 | −8.082613e−23 | −3.526372e−22 | 6.681382e−21 |
| C5 | −1.967221e−26 | −7.704679e−27 | −4.618168e−26 |
| C6 | 1.266402e−29 | −4.719101e−31 | −1.117841e−29 |
| C7 | −8.622711e−34 | 2.794633e−35 | 6.554350e−34 |
| C8 | 1.902299e−38 | −3.716332e−40 | −1.099816e−38 |

TABLE 2a

| SURF | RADIUS | THICKNESS | MATERIAL | INDEX | SEMIDIAM. |
|---|---|---|---|---|---|
| 0 = OB | ∞ | 31.284792 | | | 52.000 |
| 1 | ∞ | 0.000000 | | | 65.651 |
| 2 | 193.599182 | 32.235664 | SIO2V | 1.56078570 | 74.583 |
| 3 | −988.153919 | 6.121005 | | | 74.317 |
| 4 | 95.312730 | 28.437060 | SIO2V | 1.56078570 | 70.720 |

TABLE 2a-continued

| SURF | RADIUS | THICKNESS | MATERIAL | INDEX | SEMIDIAM. |
|---|---|---|---|---|---|
| 5 | 149.958061 | 29.337945 | | | 65.762 |
| 6 | 990.600274 | 14.692793 | SIO2V | 1.56078570 | 60.664 |
| 7 | −304.549723 | 0.925424 | | | 59.160 |
| 8 | 405.862783 | 15.231330 | SIO2V | 1.56078570 | 54.862 |
| 9 | −150.695673 | 27.371286 | | | 52.107 |
| 10 | ∞ | 32.082969 | | | 43.913 |
| 11 | −57.761263 | 34.954745 | SIO2V | 1.56078570 | 47.628 |
| 12 | −73.049428 | 0.946034 | | | 64.468 |
| 13 | 371.078196 | 22.631363 | SIO2V | 1.56078570 | 85.710 |
| 14 | −1054.171246 | 2.527973 | | | 87.142 |
| 15 | 176.905790 | 40.262309 | SIO2V | 1.56078570 | 93.860 |
| 16 | −409.710820 | 29.670881 | | | 92.937 |
| 17 | ∞ | 262.083723 | | | 87.656 |
| 18 | −152.961072 | −262.083723 | REFL | | 102.730 |
| 19 | 259.893027 | 262.083723 | REFL | | 180.288 |
| 20 | ∞ | 40.275992 | | | 112.284 |
| 21 | 277.112135 | 28.048210 | SIO2V | 1.56078570 | 94.722 |
| 22 | −1786.674721 | 65.923060 | | | 91.958 |
| 23 | −115.766876 | 9.003310 | SIO2V | 1.56078570 | 70.538 |
| 24 | 143.904953 | 28.199458 | | | 69.827 |
| 25 | −500.404643 | 8.993973 | SIO2V | 1.56078570 | 71.476 |
| 26 | 231.435891 | 40.923491 | | | 79.540 |
| 27 | −194.421161 | 14.041869 | SIO2V | 1.56078570 | 83.835 |
| 28 | −929.354406 | 6.572149 | | | 102.684 |
| 29 | 1551.636561 | 74.150055 | SIO2V | 1.56078570 | 118.556 |
| 30 | −151.390217 | 0.924156 | | | 124.858 |
| 31 | 430.573439 | 62.728287 | SIO2V | 1.56078570 | 165.041 |
| 32 | −668.844997 | 23.423849 | | | 165.694 |
| 33 | 303.567518 | 38.823785 | SIO2V | 1.56078570 | 163.062 |
| 34 | 524.212908 | 0.932060 | | | 160.960 |
| 35 | 176.353964 | 40.731123 | SIO2V | 1.56078570 | 143.422 |
| 36 | 247.491117 | 0.936510 | | | 137.926 |
| 37 | 153.122143 | 51.077607 | SIO2V | 1.56078570 | 124.946 |
| 38 | 412.041144 | 0.825571 | | | 118.371 |
| 39 | 101.547710 | 45.611823 | SIO2V | 1.56078570 | 89.393 |
| 40 | 315.478434 | 0.825571 | | | 80.057 |
| 41 | 58.429322 | 8.969645 | SIO2V | 1.56078570 | 53.083 |
| 42 | 38.144755 | 40.197998 | (F) | 1.80000000 | 37.922 |
| 43 | ∞ | 3.000000 | SAPHIR | 1.92650829 | 25.925 |
| 44 | ∞ | 4.345594 | (IMMERS.) | 1.80000000 | 21.446 |
| 45 = IM | ∞ | | | | 13.000 |

TABLE 2b

| ASPHERIC CONSTANTS | | | | | |
|---|---|---|---|---|---|
| SRF | 2 | 6 | 9 | 16 | 18 |
| K | 0 | 0 | 0 | 0 | 0 |
| C1 | 1.958847e−07 | 1.048404e−07 | 6.380918e−07 | 1.042335e−07 | 1.494444e−08 |
| C2 | 8.684629e−13 | −9.344654e−11 | 1.135337e−11 | −1.647926e−12 | 6.329335e−13 |
| C3 | −1.177298e−15 | 9.684195e−15 | 2.969291e−14 | −1.770077e−16 | 1.568829e−17 |
| C4 | 5.172091e−20 | −1.242151e−18 | −8.230472e−18 | 1.938739e−20 | 1.153993e−21 |
| C5 | 1.115087e−23 | 1.848517e−22 | 3.507973e−21 | −8.862178e−25 | −3.871456e−26 |
| C6 | −9.813899e−28 | −8.222149e−27 | 3.205808e−26 | 1.726247e−29 | 3.672792e−30 |
| SRF | 19 | 23 | 26 | 29 | 34 |
| K | −0.273225 | 0 | 0 | 0 | 0 |
| C1 | −4.825071e−10 | 5.116169e−07 | 3.252068e−07 | −2.515552e−08 | −1.130904e−08 |
| C2 | −6.621967e−15 | −7.631783e−11 | −4.649504e−11 | 1.947845e−13 | 2.463683e−13 |
| C3 | −6.600515e−20 | 1.115383e−14 | −2.574578e−15 | −1.814191e−17 | −1.101814e−17 |
| C4 | −4.043335e−24 | −1.308686e−18 | 1.022883e−18 | −1.328934e−21 | −2.972090e−22 |
| C5 | 4.835743e−29 | 1.177910e−22 | −9.907368e−23 | 1.639600e−25 | 1.942591e−26 |
| C6 | −1.092461e−33 | −3.908759e−27 | 3.745941e−27 | −5.808419e−30 | −2.321607e−31 |
| SRF | 38 | 40 | | | |
| K | 0 | 0 | | | |
| C1 | 2.336279e−08 | 1.464967e−07 | | | |
| C2 | −1.224680e−12 | 1.974044e−12 | | | |
| C3 | 1.869425e−16 | −4.637058e−16 | | | |
| C4 | −1.001651e−20 | 1.216769e−19 | | | |

TABLE 2b-continued

| ASPHERIC CONSTANTS | | |
|---|---|---|
| C5 | 3.399061e−25 | −1.544405e−23 |
| C6 | −4.264065e−30 | 7.169909e−28 |

The invention claimed is:

1. An arrangement of optical elements, comprising:
 a) a rigid first optical element having a concave optical surface and is formed as a meniscus lens, wherein the first optical element is made of fused silica or of a crystal material;
 b) a rigid second optical element having a first optical surface, which faces the concave optical surface of the first optical element, and a second optical surface opposite to the first optical surface, and
 c) a liquid that at least partially fills a space formed between the first optical element and the second optical element;
 d) wherein the index of refraction of the liquid is higher than the index of refraction of the first optical element and wherein the index of refraction of the liquid is smaller than the index of refraction of the second optical element;
 e) wherein the arrangement is configured to be used in an illumination system of a microlithographic projection exposure apparatus or in a projection objective of a microlithographic projection exposure apparatus.

2. The arrangement according to claim 1, wherein the second optical surface of the second optical element is planar.

3. The arrangement according to claim 1, wherein the second optical element is a planar-parallel plate.

4. The arrangement according to claim 1, wherein the second optical element is made of a crystal material having a crystal lattice.

5. The arrangement according to claim 4, wherein the second optical element has an element axis that points in a principal crystallographic direction.

6. The arrangement according to claim 1, wherein the space between the first optical element and the second optical element is vented.

7. The arrangement according to claim 1, wherein at least one intermediate optical element is arranged in the space between the first optical element and the second optical element.

8. The arrangement according to claim 1 wherein the crystal material is a calcium fluoride.

9. An arrangement of optical elements, comprising:
 a) a rigid first optical element having a concave optical surface and is formed as a meniscus lens;
 b) a rigid second optical element having a first optical surface, which faces the concave optical surface of the first optical element, and a second optical surface opposite to the first optical surface, wherein the second optical element comprises a stack of planar-parallel plates; and
 c) a liquid that at least partially fills a space formed between the first optical element and the second optical elements,
 d) wherein the arrangement is configured to be used in a microlithography projection exposure apparatus.

10. The arrangement according to claim 9, wherein the stack comprises planar-parallel plates made of crystal material having a crystal lattice, the planar-parallel plates being cut parallel to different crystallographic planes.

11. The arrangement according to claim 9, wherein the stack comprises planar-parallel plates made of crystal material with a crystal lattice, the planar-parallel plates being cut in cutting planes that are parallel to equivalent crystallographic planes, and the crystal lattices of the planar-parallel plates being oriented in the stack relative to each other with an angle of rotation about an axis that is perpendicular to the cutting planes.

12. An arrangement of optical elements, comprising:
 a) a rigid first optical element having a concave optical surface;
 b) a rigid second optical element having a first optical surface, which faces the concave optical surface of the first optical element, and a second optical surface opposite to the first optical surface;
 c) a liquid that at least partially fills a space formed between the first optical element and the second optical element; and
 d) at least one intermediate optical element arranged between the first optical element and the second optical element wherein the intermediate optical element is made of a crystal material having a crystal lattice and has an element axis that points in a principal crystallographic direction;
 e) wherein the arrangement is configured to be used in an illumination system of a microlithography projection exposure apparatus or in a projection objective of a microlithographic projection exposure apparatus.

13. The arrangement according to claim 12, wherein the second optical element and the intermediate optical element have element axes that point in different principal crystallographic directions.

14. The arrangement according to claim 12, wherein the element axes of the second optical element and of the intermediate optical element point in equivalent principal crystallographic directions, and wherein the crystal lattices of the second optical element and the intermediate optical element are oriented relative to each other with an angle of rotation about the element axes.

15. An arrangement of optical elements comprising:
 a) a rigid first optical element having a concave optical surface;
 b) a rigid second optical element having a first optical surface, which faces the concave optical surface of the first optical element, and a second optical surface opposite to the first optical surface;
 c) a liquid that at least partially fills a space formed between the first optical element and the second optical element; and
 d) at plurality of intermediate optical element arranged in the space between the first optical element and the second optical element, the intermediate optical elements being made of a crystal material having a crystal lattice,
 e) wherein the arrangement is configured to be used in an illumination system of a microlithography projection exposure apparatus or in a projection objective of a microlithographic projection exposure apparatus and at least some of the intermediate optical elements have respective element axes that point in different principal crystallographic directions.

16. An arrangement of optical elements comprising:
a) a rigid first optical element having a concave optical surface;
b) a rigid second optical element having a first optical surface, which faces the concave optical surface of the first optical element, and a second optical surface opposite to the first optical surface;
c) a liquid that at least partially fills a space formed between the first optical element and the second optical element; and
d) a plurality of intermediate optical elements is arranged in the space between the first optical element and the second optical element, the intermediate optical elements being made of a crystal material having a crystal lattice,
e) wherein the arrangement is configured to be used in an illumination system of a microlithography projection exposure apparatus or in a projection objective of a microlithographic projection exposure apparatus and at least some of the intermediate optical elements have respective element axes that point in equivalent principal crystallographic directions, and wherein the crystal lattices of the intermediate optical elements are oriented relative to each other with an angle of rotation about the element axes.

17. An arrangement of optical elements comprising:
a) a rigid first optical element having a concave optical surface;
b) a rigid second optical element having a first optical surface, which faces the concave optical surface of the first optical element, and a second optical surface opposite to the first optical surface;
c) a liquid that at least partially fills a space formed between the first optical element and the second optical element; and
d) wherein the arrangement of optical elements is configured to be used in a microlithographic projection objective that includes a plurality of optical elements arranged between an object plane and an image plane and the microlithography projection objective is a catadioptric projection objective, and the concave optical surface of the first optical element is located at the image side of the first optical element.

18. The arrangement according to claim 17, wherein the second optical element is situated closer to the image plane than any other rigid optical element of the objective.

19. The arrangement according to claim 17, wherein the objective is designed for operating at a wavelength of below 200 nm.

20. The arrangement according to claim 19, wherein the objective is designed for operating at a wavelength of 193 nm or 157 nm.

21. A microlithographic projection exposure apparatus comprising an illumination system and an objective comprising the arrangement according to claim 17, which projects an object onto a substrate.

22. An apparatus, comprising:
an arrangement of optical elements, the arrangement of optical elements comprising:
a) a rigid first optical element having a concave optical surface;
b) a rigid second optical element having a first optical surface, which faces the concave optical surface of the first optical element, and a second optical surface opposite to the first optical surface; and
c) a liquid that at least partially fills a space formed between the first optical element and the second optical element, wherein the index of refraction of the liquid is higher than the index of refraction of the first optical element, is smaller than the index of refraction of the second optical element,
d) wherein the apparatus is a microlithographic projection exposure apparatus.

23. A method for the microlithographic production of a micro-structured component by means of a microlithographic projection exposure apparatus according to claim 22.

24. The apparatus according to claim 22 wherein the first optical element is made of fused silica or of a crystal material.

25. The apparatus according to claim 22 wherein the first optical element is formed as a meniscus lens.

26. The apparatus according to claim 22 wherein the second optical element has at least one planar optical surface.

27. The apparatus according to claim 26, wherein the second optical surface of the second optical element is planar.

28. The apparatus according to claim 26, wherein the second optical element is made of a crystal material having a crystal lattice, wherein the crystal material is one of lithium fluoride, sapphire, or spinel.

29. The apparatus according to claim 28, wherein the second optical element has an element axis that points in a principal crystallographic direction.

30. The apparatus according to claim 22, wherein the space between the first optical element and the second optical element is vented.

31. The apparatus according to claim 22, wherein at least one intermediate optical element is arranged in the space between the first optical element and the second optical element.

32. An apparatus, comprising:
an arrangement of optical elements, the arrangement of optical elements comprising:
a) a rigid first optical element having a concave optical surface;
b) a rigid second optical element having a first optical surface, which faces the concave optical surface of the first optical element, and a second optical surface opposite to the first optical surface; and
c) a liquid that at least partially fills a space formed between the first optical element and the second optical element, wherein the second optical element is a planar-parallel plate,
d) wherein the apparatus is a catadioptric microlithographic projection exposure apparatus.

33. An arrangement of optical elements, comprising:
a) a rigid first optical element having a concave optical surface;
b) a rigid second optical element having a first optical surface, which faces the concave optical surface of the first optical element, and a second optical surface opposite to the first optical surface, and
c) a liquid that at least partially fills a space formed between the first optical element and the second optical element, wherein the second optical element has at least one planar optical surface;
d) wherein the index of refraction of the liquid is higher than the index of refraction of the first optical element and wherein the index of refraction of the liquid is smaller than the index of refraction of the second optical element;

e) wherein the arrangement is configured to be used in an illumination system of a microlithographic projection exposure apparatus or in a projection objective of a microlithographic projection exposure apparatus.

34. The arrangement according to claim 33, wherein the arrangement is a catadioptric objective of a microlithography projection exposure apparatus.

35. The arrangement according to claim 33, wherein the second optical element is a planar-parallel plate.

36. The arrangement of claim 33, wherein the arrangement is a projection objective and the second optical element is the rigid element positioned closest to an image plane of the projection objective.

37. An apparatus, comprising:
a first rigid optical element;
a second rigid optical element; and
a liquid that at least partially fills a space formed between the first optical element and the second optical element,
wherein an index of refraction of the liquid is higher than or equal to the index of refraction of the first optical element, the index of refraction of the liquid is smaller than or equal to the index of refraction of the second optical element, and the apparatus is an illumination system of a microlithography projection exposure apparatus or in a projection objective of a microlithography projection exposure apparatus.

38. An apparatus having an optical axis, comprising:
a first rigid optical element;
a second rigid optical element;
a liquid that at least partially fills a space formed between the first and second optical elements; and
at least one intermediate optical element arranged between the first optical element and the second optical element, the at least one intermediate optical element being made of a crystal material having a crystal lattice arranged so that a principal crystallographic direction of the crystal lattice is parallel to the optical axis;
wherein the apparatus is an illumination system of a microlithography projection exposure apparatus or in a projection objective of a microlithography projection exposure apparatus.

39. An apparatus, comprising:
a rigid first optical element having a concave optical surface;
a rigid second optical element having a first optical surface, which faces the concave optical surface of the first optical element, and second optical surface opposite to the first optical surface; and
a liquid that at least partially fills a space formed between the first optical element and the second optical element, wherein the space between the first optical element and the second optical element is hydraulically interconnected to a venting tank,
wherein the apparatus is a microlithographic projection exposure apparatus.

40. An apparatus, comprising:
a rigid first optical element having a concave optical surface;
a rigid second optical element having a first optical surface, which faces the concave optical surface of the first optical element, and a second optical surface opposite to the first optical surface;
a liquid that at least partially fills a space formed between the first optical element and the second optical element; and
at least one intermediate optical element arranged between the first optical element and the second optical element wherein the intermediate optical element is made of a crystal material having a crystal lattice and has an element axis that points in a principal crystallographic direction,
wherein the apparatus is a microlithographic projection exposure apparatus.

41. An apparatus, comprising:
a rigid first optical element having a concave optical surface;
a rigid second optical element having a first optical surface, which faces the concave optical surface of the first optical element, and a second optical surface opposite to the first optical surface;
a first liquid that partially fills a space formed between the first optical element and the second optical element;
a second liquid adjacent to the second optical surface of the second optical element,
wherein the apparatus is a microlithographic projection exposure apparatus.

42. An apparatus, comprising:
a rigid first optical element having a concave optical surface;
a rigid second optical element having a first optical surface, which faces the concave optical surface of the first optical element, and a second optical surface opposite to the first optical surface; and
a liquid that at least partially fills a space formed between the first optical element and the second optical element,
wherein the apparatus is a microlithographic projection objective that includes a plurality of optical elements arranged between an object plane and an image plane and an image side numerical aperture of the microlithographic projection objective has a value of at least 1.0 .

43. An arrangement of optical elements, comprising:
a) a rigid first optical element having a concave optical surface and is formed as a meniscus lens;
b) a rigid second optical element having a first optical surface, which faces the concave optical surface of the first optical element, and a second optical surface opposite to the first optical surface, where the second optical element has at least one planar optical surface, and
c) a liquid that at least partially fills a space formed between the first optical element and the second optical element;
d) wherein the index of refraction of the liquid is higher than the index of refraction of the first optical element and wherein the index of refraction of the liquid is smaller than the index of refraction of the second optical element;
e) wherein the arrangement is configured to be used in an illumination system of a microlithographic projection exposure apparatus or in a projection objective of a microlithographic projection exposure apparatus.

44. The arrangement according to claim 43, wherein the second optical surface of the second optical element is a planar-parallel plate.

45. An arrangement of optical elements, comprising:
a) a rigid first optical element having a concave optical surface and is formed as a meniscus lens;
b) a rigid second optical element having a first optical surface, which faces the concave optical surface of the first optical element, and a second optical surface opposite to the first optical surface, where the second optical element is made of a crystal material having a crystal lattice, and
c) a liquid that at least partially fills a space formed between the first optical element and the second optical element;

d) wherein the index of refraction of the liquid is higher than the index of refraction of the first optical element and wherein the index of refraction of the liquid is smaller than the index of refraction of the second optical element;

e) wherein the arrangement is configured to be used in an illumination system of a microlithographic projection exposure apparatus or in a projection objective of a microlithographic projection exposure apparatus.

46. The arrangement according to claim 45, wherein the second optical element is made of Lithium fluoride, sapphire or spinel.

47. The arrangement according to claim 45, wherein the second optical element has an element axis that points in a principal crystallographic direction.

48. An arrangement of optical elements, comprising:

a) a rigid first optical element having a concave optical surface and is formed as a meniscus lens;

b) a rigid second optical element having a first optical surface, which faces the concave optical surface of the first optical element, and a second optical surface opposite to the first optical surface, and c) a liquid that at least partially fills a space formed between the first optical element and the second optical element;

d) wherein the index of refraction of the liquid is higher than the index of refraction of the first optical element and wherein the index of refraction of the liquid is smaller than the index of refraction of the second optical element;

e) wherein the arrangement is configured to be used in an illumination system of a microlithographic projection exposure apparatus or in a projection objective of a microlithographic projection exposure apparatus; and f) wherein at least one intermediate optical element is arranged in the space between the first optical element and the second optical element.

49. An arrangement of optical elements comprising:

a) a rigid first optical element having a concave optical surface;

b) a rigid second optical element having a first optical surface, which faces the concave optical surface of the first optical element, and a second optical surface opposite to the first optical surface;

c) a liquid that at least partially fills a space formed between the first optical element and the second optical element; and d) wherein the arrangement of optical elements is configured to be used in a microlithographic projection objective that includes a plurality of optical elements arranged between an object plane and an image plane and the microlithography projection objective is a catadioptric projection objective, and where the second optical element is located on the image side of the first optical element.

50. An arrangement of optical elements comprising:

a) a rigid first optical element having a concave optical surface;

b) a rigid second optical element having a first optical surface, which faces the concave optical surface of the first optical element, and a second optical surface opposite to the first optical surface;

c) a liquid that at least partially fills a space formed between the first optical element and the second optical element; and d) wherein the arrangement of optical elements is configured to be used in a microlithographic projection objective that includes a plurality of optical elements arranged between an object plane and an image plane and the microlithography projection objective is a catadioptric projection objective, and where the image side numerical aperture has a value of at least 1.0.

51. An arrangement of optical elements comprising:

a) a rigid first optical element having a concave optical surface;

b) a rigid second optical element having a first optical surface, which faces the concave optical surface of the first optical element, and a second optical surface opposite to the first optical surface;

c) a liquid that at least partially fills a space formed between the first optical element and the second optical element; and d) wherein the arrangement of optical elements is configured to be used in a microlithographic projection objective that includes a plurality of optical elements arranged between an object plane and an image plane and the microlithography projection objective is a catadioptric projection objective, and where at least two of the optical elements are mirrors.

52. A microlithographic projection exposure apparatus, comprising:

an illumination system; and an objective which projects an object onto a substrate, the objective comprising an arrangement of optical elements comprising:

a) a rigid first optical element having a concave optical surface;

b) a rigid second optical element having a first optical surface, which faces the concave optical surface of the first optical element, and a second optical surface opposite to the first optical surface;

c) a liquid that at least partially fills a space formed between the first optical element and the second optical element; and d) wherein the arrangement of optical elements is configured to be used in a microlithographic projection objective that includes a plurality of optical elements arranged between an object plane and an image plane and the microlithography projection objective is a catadioptric projection objective.

53. An arrangement of optical elements, comprising:

a) a rigid first optical element having a concave optical surface, where the first optical element is made of fused silica or of a crystal material;

b) a rigid second optical element having a first optical surface, which faces the concave optical surface of the first optical element, and a second optical surface opposite to the first optical surface, and c) a liquid that at least partially fills a space formed between the first optical element and the second optical element;

d) wherein the index of refraction of the liquid is higher than the index of refraction of the first optical element and wherein the index of refraction of the liquid is smaller than the index of refraction of the second optical element;

e) wherein the arrangement is configured to be used in an illumination system of a microlithographic projection exposure apparatus or in a projection objective of a microlithographic projection exposure apparatus.

54. An arrangement of optical elements, comprising:

a) a rigid first optical element having a concave optical surface;

b) a rigid second optical element having a first optical surface, which faces the concave optical surface of the first optical element, and a second optical surface opposite to the first optical surface, and
c) a liquid that at least partially fills a space formed between the first optical element and the second optical element;
d) wherein the index of refraction of the liquid is higher than the index of refraction of the first optical element and wherein the index of refraction of the liquid is smaller than the index of refraction of the second optical element;
e) wherein the arrangement is a projection objective and the second optical element is the rigid element positioned closest to an image plane of the projection objective.

* * * * *

UNITED STATES PATENT AND TRADEMARK OFFICE
CERTIFICATE OF CORRECTION

PATENT NO.       : 7,474,469 B2
APPLICATION NO.  : 11/232606
DATED            : January 6, 2009
INVENTOR(S)      : Michael Totzeck et al.

It is certified that error appears in the above-identified patent and that said Letters Patent is hereby corrected as shown below:

Cover page, Related U.S. Application Data, line 8, delete "Dec. 19, 2004" insert --Dec. 19, 2003--.

Cover page, References Cited, U.S. Patent Documents, page 2, line 32, delete "Weissenreider et al." insert --Weissenrieder et al.--.

Column 1, line 16, delete "Jul. in 29," insert --on Jul. 29--.

Column 5, line 17, delete "H3PO4" insert --$H_3PO_4$--.

Column 17, line 61, Claim 9, delete "elements," insert --element,--.

Column 19, line 14, Claim 16, after "elements" delete "is".

Column 19, line 52, Claim 19, after "wavelength" delete "of".

Column 20, line 7, Claim 22, delete "is" insert --and is--.

Signed and Sealed this

Third Day of March, 2009

JOHN DOLL
*Acting Director of the United States Patent and Trademark Office*